United States Patent
Lu et al.

(10) Patent No.: US 6,605,525 B2
(45) Date of Patent: *Aug. 12, 2003

(54) METHOD FOR FORMING A WAFER LEVEL PACKAGE INCORPORATING A MULTIPLICITY OF ELASTOMERIC BLOCKS AND PACKAGE FORMED

(75) Inventors: Szu-Wei Lu, Hsinchu (TW); Ming Lu, Taipei (TW); Jyh-Rong Lin, Tu-Cheng (TW)

(73) Assignee: Industrial Technologies Research Institute, Hsin Chu (TW)

( * ) Notice: Subject to any disclaimer, the term of this patent is extended or adjusted under 35 U.S.C. 154(b) by 51 days.

This patent is subject to a terminal disclaimer.

(21) Appl. No.: 09/846,643

(22) Filed: May 1, 2001

(65) Prior Publication Data

US 2002/0164840 A1 Nov. 7, 2002

(51) Int. Cl.$^7$ .............................................. H01L 21/44
(52) U.S. Cl. ........................................ 438/617; 438/113
(58) Field of Search ................................ 438/106, 107, 438/108, 113, 114, 115, 462, 118, 637, 612, 613, 617, 614; 257/737, 753, 762, 765, 782, 792, 700

(56) References Cited

U.S. PATENT DOCUMENTS

| | | | | | |
|---|---|---|---|---|---|
| 5,436,411 A | * | 7/1995 | Pasch | ........................ | 174/261 |
| 5,851,911 A | * | 12/1998 | Farnworth | .................. | 438/614 |
| 6,008,543 A | * | 12/1999 | Iwabuchi | .................... | 257/778 |
| 6,050,832 A | * | 4/2000 | Lee et al. | ...................... | 439/91 |
| 6,095,397 A | * | 8/2000 | Wolf et al. | ................... | 228/33 |
| 6,103,552 A | * | 8/2000 | Lin | ............................ | 438/113 |
| 6,197,613 B1 | * | 3/2001 | Kung et al. | ................. | 438/106 |
| 6,358,836 B1 | * | 3/2002 | Lu et al. | ..................... | 257/779 |
| 6,426,562 B2 | * | 7/2002 | Farnworth | .................. | 257/779 |

* cited by examiner

*Primary Examiner*—Olik Chaudhuri
*Assistant Examiner*—Brook Kebede
(74) *Attorney, Agent, or Firm*—Tung & Associates

(57) ABSTRACT

A method for forming a wafer level package incorporating a multiplicity of elastomeric blocks as stress buffering layer and package formed are described. The method incorporates the step of forming metal lines in-between the plurality of IC dies on a wafer during the same process used for forming the metal vias. The metal lines are subsequently removed by either a mechanical method such as dicing with a diamond saw or by a chemical method such as wet etching. The method allows the fabrications of a wafer level package that has a multiplicity of elastomeric blocks formed on top as stress buffering layer without the CTE mismatch problem with other layers on the wafer.

12 Claims, 4 Drawing Sheets

METHOD FOR FORMING A WAFER LEVEL PACKAGE INCORPORATING A MULTIPLICITY OF ELASTOMERIC BLOCKS AND PACKAGE FORMED

FIELD OF THE INVENTION

The present invention generally relates to a wafer packaging method and package formed and more particularly, relates to a method for forming a wafer level package incorporating a multiplicity of elastomeric blocks as stress buffers without the coefficient of thermal expansion mismatch problem and package formed by the method.

BACKGROUND OF THE INVENTION

In recent years, wafer level packages or wafer level chip scale packages have been developed as a new low cost packaging technique for high volume production of IC chips. One of the chip scale packaging techniques has been developed by the Tessera Company for making a so-called micro-BGA package. The micro-BGA package can be utilized in an environment where several of the packages are arranged in close proximity on a circuit board or a substrate much like the arrangement of individual tiles. Major benefits achieved by a micro-BGA package are the combined advantages of a flip chip assembly and a surface mount package. The chip scale packages can be formed in a physical size comparable to that of an IC chip even though, unlike a conventional IC chip such as a flip chip, the chip scale package does not require a special bonding process for forming solder balls. Furthermore, a chip scale package may provide larger number of input/output terminals than that possible from a conventional quad flat package, even though a typical quad flat package is better protected mechanically from the environment.

In a typical micro-BGA package, a flexible interposer layer (which may contain circuit) is used to interconnect bond pads on an IC chip to an array of solder bump connections located on a flexible circuit. The flexible circuit, normally of a thickness of approximately 25 nm, is formed of a polymeric material such as polyimide which is laminated to a silicon elastomer layer of approximately 150 nm thick. The silicon elastomeric layer provides flexibility and compliance in all three directions for relief of stresses and thermal expansion mismatches. To further reduce the fabrication cost of IC devices, it is desirable that if a whole wafer can be passivated to seal the IC dies on the wafer, and then be severed into individual IC dies from the wafer such that not only the benefits of a chip scale package can be realized, the packaging cost for the IC dies may further be reduced.

The conventional flip-chip bonding process requires multiple preparation steps for IC chips, i.e. the formation of aluminum bond pads on the chip, the under-bump-metallurgy process on the bond pads and the deposition of solder required in the bumping process. The substrate that the IC chip is bonded to requires a flux coating in order to ensure an acceptable bond strength is formed between the solder bumps and the conductive elements on the substrate surface. The flip chip bonding process further requires a reflow process for the bumps, a flux cleaning process to eliminate excess flux material from the surface of the bump, a drying process after the cleaning process, an underfill process for dispensing an underfill material, and an underfill curing process to minimize thermal stresses in the underfill and in the joint formed.

The conventional method for depositing solder bumps described above presents a number of processing difficulties. For instance, in modern high-density semiconductor devices, the distance between I/O pads in a peripheral array continuously being reduced. In order to maintain a minimal required distance between the I/O pads, an I/O pad redistribution process must be conducted such that the pads can be transformed from a peripheral array to an area array. During the pad redistribution process, a plurality of metal traces must be formed to extend the I/O pads from the periphery of an IC die to the center of the IC die. It is desirable that, in order to assure the reliability of the die, a stress buffer layer is provided under the plurality of metal traces to buffer, or absorb, the stress incurred during the fabrication processes and to avoid stress cracking or fracture of the metal traces. The application of the stress buffering layers has been difficult in that if too thin a layer is applied, the stress buffering effect is insufficient to ensure the reliability of the IC die. However, when too thicker a layer of the stress buffering material is applied, numerous processing difficulties are incurred in the application process. Even though commercial stress buffering materials have been available in the marketplace, the fabrication technology for applying such materials to a satisfactory thickness has not been developed.

One of the difficulties incurred in utilizing the stress buffering material is that, since the material must have a relatively low Young's modulus, it also comes with a coefficient of thermal expansion (CTE) that is significantly larger than other materials normally used in semiconductor processing. The thermal stresses produced by the CTE mismatch may be large enough to cause damages to the solder bumps formed on top of the wafer. The CTE mismatch problem between the stress buffer material and the insulating or metal conductive layers must be resolved before an elastomeric material may be used as a stress buffering layer. Since it is extremely difficult, or impossible to slice or sever the elastomeric material layer after deposited onto the top surface of a wafer, i.e. either mechanically or by a laser, a method for separating the elastomeric material layer into smaller blocks is very desirable in order to fully utilize the technology.

It is therefore an object of the present invention to provide a method for forming a wafer level package incorporating a multiplicity of elastomeric blocks as stress buffering layer that does not have the drawbacks or shortcomings of the conventional methods.

It is another object of the present invention to provide a method for forming a wafer level package incorporating multiplicity of elastomeric blocks as a stress buffering layer that does not require any additional fabrication steps.

It is a further object of the present invention for forming a wafer level package incorporating a multiplicity of elastomeric blocks by first forming metal lines between the IC dies prior to the deposition of elastomeric material on the wafer.

It is still another object of the present invention to provide a method for forming a wafer level package incorporating a multiplicity of elastomeric blocks by first depositing a thick photoresist layer for forming a plurality of metal lines and a plurality of trench openings between the IC dies.

It is yet another object of the present invention to provide a method for forming a wafer level package incorporating a multiplicity of elastomeric blocks as stress buffering layer by first depositing photoresist layer of at least 20 $\mu$m thickness for forming metal lines between the IC dies.

It is still another further object of the present invention to provide a wafer level package that has a multiplicity of elastomeric blocks formed on top as stress buffering layer without causing any CTE mismatch problem with other layers in the IC dies.

It is yet another further object of the present invention to provide a method for forming a wafer level package incorporating a multiplicity of elastomeric blocks formed by first forming a plurality of metal lines between the IC dies and then removing the metal lines during a die sawing process for severing the IC chips.

SUMMARY OF THE INVENTION

In accordance with the present inventions, a method for forming a wafer level package incorporating a multiplicity of elastomeric blocks as stress buffering layer in the package is disclosed.

In a preferred embodiment, a method for forming a wafer level package incorporating a multiplicity of elastomeric blocks can be carried out by the operating steps of first providing a wafer that is pre-processed with a plurality of IC dies formed on a top surface, each of the plurality of IC dies being spaced-apart from its immediately adjacent IC dies by a distance that is at least a width of a scribe line, each on the plurality of IC dies further having a multiplicity of input/output pads formed on top; depositing a first material layer on the top surface of the wafer; depositing a photoresist layer of at least 20 µm thickness on the first metal layer; forming a plurality of trench openings separating the plurality of IC dies and a plurality of via openings each on top of one of the multiplicity of input/output pads exposing the first metal layer; depositing a second metal into and filling the plurality of trench openings forming a plurality of metal lines and the plurality of via openings forming a plurality of metal vias; removing the photoresist layer in the first metal layer that is not covered by the plurality of metal lines and the plurality of metal vias; and depositing an elastomeric material on top of the wafer filling cavities formed between the plurality of metal lines and metal vias forming the multiplicity of elastomeric blocks.

The method for forming a wafer level package incorporating a multiplicity of elastomeric blocks may further include the steps after the deposition of the elastomeric material of depositing a first insulating material layer on top of the plurality of elastomeric blocks; depositing a third metal layer on top of the first insulating material layer and forming into conductive leads for input/output redistribution; and depositing a second insulating material layer on top of the conductive leads and the first insulating material layer. The method may further include the steps of after the deposition of the second insulating material layer, forming a plurality of openings in the second insulation material layer exposing the third metal layer forming a plurality of solder bumps on the plurality of input/output redistribution pads.

The method may further include the step of forming under-bump-metallurgy (UBM) layers on the plurality of input/output redistribution pads before the formation of the plurality of solder bumps, or the step of depositing the first metal layer with a metal of Cu, Al, or alloys thereof, or the step of depositing the photoresist layer to a thickness between about 20 µm and about 200 µm. The method may further include the step of depositing the second metal with a metal of Cu, Al or alloys thereof. The formation step for the plurality of trench openings and via openings may further include the steps of photolithography and dry etching.

The method may further include the step of depositing the elastomeric material by a printing technique or by a spin-coating technique. The method may further include the step of forming the plurality of solder bumps by a technique selected from the group consisting of printing, electroplating and electroless plating, or the step of forming the plurality of solder bumps with a solder material containing Pb and Sn. The method may further include the step of severing the plurality of IC dies by a mechanical means of by wet etching.

The present invention further discloses a wafer level package that has a multiplicity of elastomeric blocks formed on top including a wafer that is pre-processed with a plurality of IC dies formed on a top surface. Each of the plurality of IC dies has a multiplicity of input/output pads formed on top; a plurality of metal lines separating the plurality of IC dies formed on a plurality of scribe line on the top surface of the wafer; a plurality of metal vias each in electrical communication with one of the plurality of input/output pads; and an elastomeric material filling cavities formed in-between the plurality of metal lines forming the multiplicity of elastomeric blocks.

The wafer level package that has a multiplicity of elastomeric blocks formed on top may further include a first insulating material layer on top of the multiplicity of elastomeric blocks; a plurality of conductive leads for input/output redistribution wherein one end of each of the plurality of conductive leads being in electrical communication with one of the plurality of metal vias; and a second insulating material layer on top of the plurality of conductive leads and the first insulating material layer. The wafer level package that has a multiplicity of elastomeric blocks on top may further include a plurality of openings in the second insulating materials layer exposing the third metal layer forming a plurality of input/output redistribution pads; and a plurality of solder bumps with each formed on one of the plurality of input/output redistribution pads. The wafer level package may further include UBM layer in-between the plurality of input/output redistribution pads and the plurality of solder bumps. The plurality of solder bumps may be reflown into a plurality of solder balls. The plurality of metal lines may be formed of Cu, Al or alloys thereof, while the plurality of metal vias may be formed of Cu, Al or alloys thereof, the elastomeric material has a Young's modulus of not higher than 10 MPa.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

Figure 1:
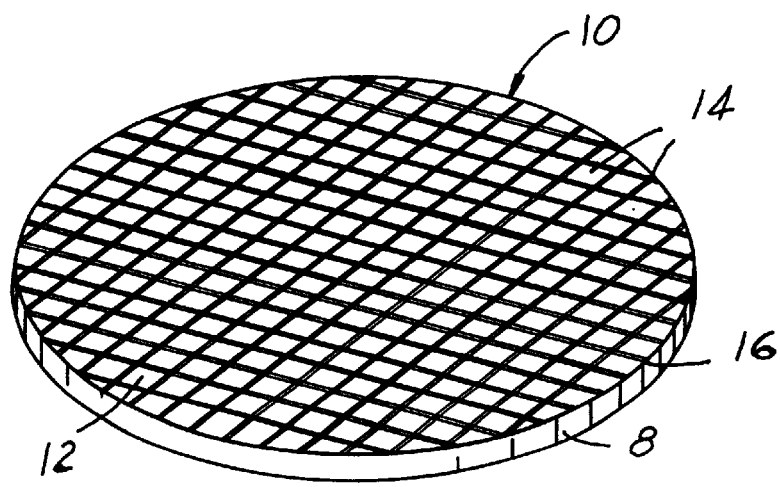
FIG. 1 is a perspective view of the present invention wafer level package with a plurality of metal lines formed in-between the IC dies.

The present invention discloses a method for forming a wafer level package incorporating a multiplicity of elastomeric block as stress buffering layer and packages formed by the method.

The invention method can be carried out by first providing a wafer that is pre-processed with a plurality of IC dies formed on a top active surface. Each of the plurality of IC dies is spaced-apart from its immediate adjacent IC dies by a distance that is at least a width of a scribed line. Each of the plurality of IC dies has a multiplicity of input/output pads formed on a top surface. The first metal layer is then deposited on the top surface of the wafer followed by a deposition of a photoresist layer that has a thickness of at least 20 $\mu$m thick on the first metal layer. A plurality of trench opening separating the plurality of IC dies and a plurality of via openings with each on top of one of the multiplicity of input/output pads are then formed to expose the first metal layer. A second metal is then deposited to fill the plurality of trench openings forming a plurality of metal lines and to fill the plurality of via openings forming a plurality of metal vias. The photoresist layer is then removed together with the first metal layer that is not covered by the plurality of metal lines and the plurality of metal vias. An elastomeric material is then deposited on top of the wafer to fill the cavities formed between the plurality of metal lines forming the multiplicity of elastomeric blocks.

The invention method may further include the steps of forming solder balls and input/output redistribution lines on top of the wafer structure. For instance, the formation of input/output redistribution lines can be carried out by depositing a first insulating material layer on top of the multiplicity of elastomeric blocks, then depositing a third metal layer on top of the first insulating material layer to form conductive leads for input/output redistribution, and depositing a second insulating material layer on top of the conductive leads and the first insulating material layer. The step of forming solder balls may include forming a plurality of openings in the second insulating material layer to expose the third metal layer to form a plurality of input/output redistribution pads, and forming a plurality of solder bumps on the plurality of input/output redistribution pads and then forming the solder bumps into solder balls.

To successfully carry out the present invention method, a photoresist layer that has a thickness of at least 20 $\mu$m or a thickness in the range between about 20 $\mu$m and about 200 $\mu$m must be deposited on a wafer surface and then formed with trench openings in order to produce metal lines of sufficient thickness for separating the IC dies. The trench openings are then filled with a metal material by a process such as electroplating to form metal lines which are subsequently removed by either a die sawing process or by a wet etching process to form the multiplicity of elastomeric blocks without the CTE mismatch problem. The thick photoresist layer can be deposited by either a printing technique or by a spin-coating technique. A thickness achieved in the preferred embodiment is about 40 $\mu$m. The word "about" used in this writing indicates a range of values that are ±10% of the average value given.

The present invention further discloses a wafer level package that has a multiplicity of elastomeric blocks formed on a top surface. The package includes a wafer that is preprocessed with a plurality of IC dies formed on the top surface, each of the plurality of IC dies has a multiplicity of input/output pads formed on top. The package has a plurality of metal lines separating the plurality of IC dies formed on a plurality of scribe lines on the top surface of the wafer, and a plurality of metal vias each in electrical communication with one of the plurality of input/output pads. The package further has an elastomeric material filling the cavities formed in-between the plurality of metal lines to form the multiplicity of elastomeric blocks on the top surface of the IC dies.

Referring initially to FIG. 1, wherein a present invention pre-processed wafer 10 for fabricating a wafer level package is shown. The wafer 10, is provided with a pre-processed top surface 12 prepared with a plurality of IC dies 14. Each of the plurality of IC dies 14 is separated from its immediately adjacent IC dies by a scribe line 16. The scribed line 16 is the same as those used in the conventional method for dicing the IC chips 14 from the silicon wafer 10. In the present invention method, the scribe line 16 may not be necessary since the metal lines to be formed can be patterned by a photolithographic technique.

Figure 2:
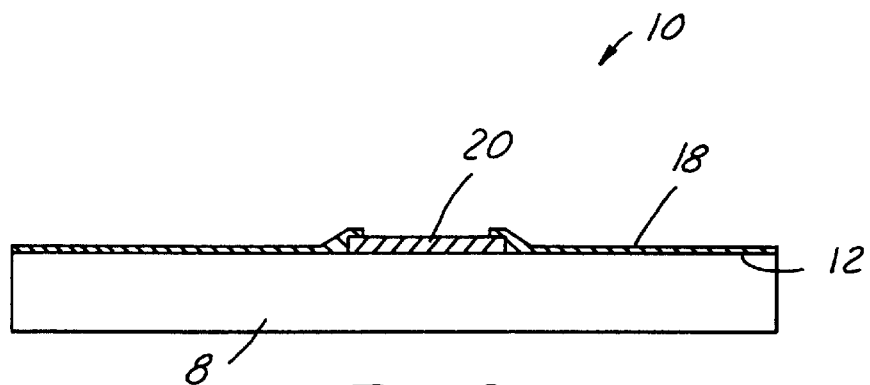
FIG. 2 is an enlarged, cross-sectional view of a present invention IC dies having a conductive pad formed on top.

Referring to FIG. 2, wherein an enlarged, cross-sectional view of a section of the present invention wafer 10 is shown. On the top surface 12 of the silicon wafer 10, is first deposited an insulating material layer 18 for insulating a multiplicity of input/output pads 20. Also shown in FIG. 2 is the silicon substrate 8 used in forming the silicon wafer 10. The input/output (I/O) pad 20 can be formed by a conductive metal such as Al, or Cu or alloys thereof.

Figure 3:
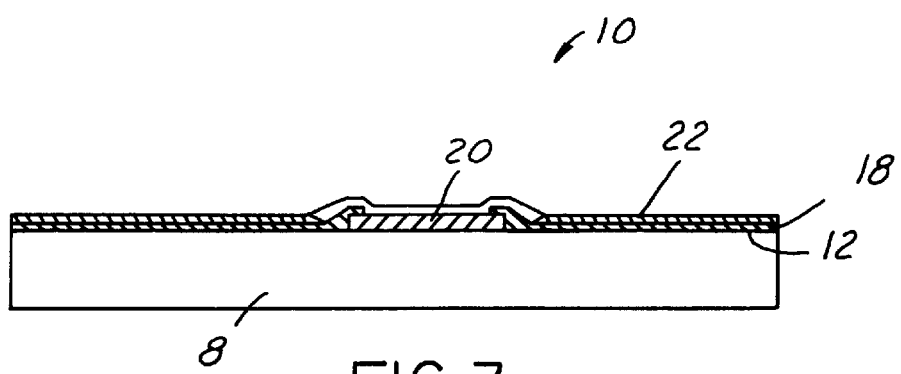
FIG. 3 is an enlarged, cross-sectional view of the present invention IC dies of FIG. 2 with a first metal layer deposited on top.
Figure 4:
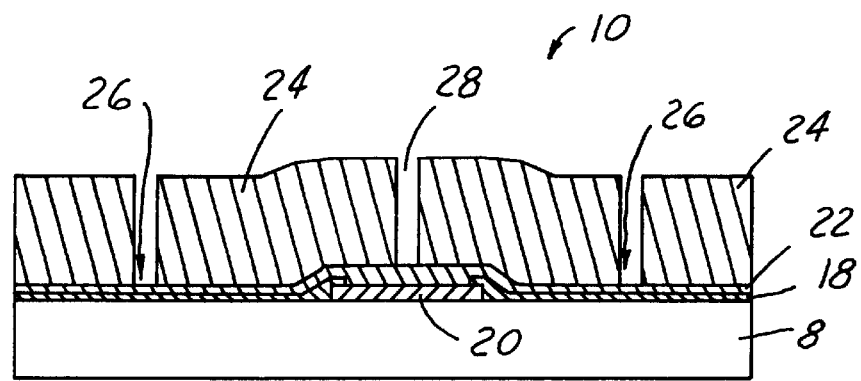
FIG. 4 is an enlarged, cross-sectional view of the present invention IC die of FIG. 3 with a thick photoresist layer deposited and patterned on top.

In the next step of the process, as shown in FIG. 3, a first metal layer 22 of Al, Cu or alloys thereof can be deposited on top of the first insulating layer 18 and the multiplicity of I/O pads 20. The first metal layer 22 can be deposited by any suitable means such as physical vapor deposition (sputtering) or evaporation. On top of the wafer 10, is then deposited a thick photoresist layer 24, i.e. having a thickness between about 20 $\mu$m and about 200 $\mu$m, and preferably between about 40 $\mu$m and about 100 $\mu$m that is formed of an organic material such as polyimide. The photoresist layer 24 is then imaged and exposed to form trench openings 26 and via openings 28 (shown in FIG. 4).

Figure 5:
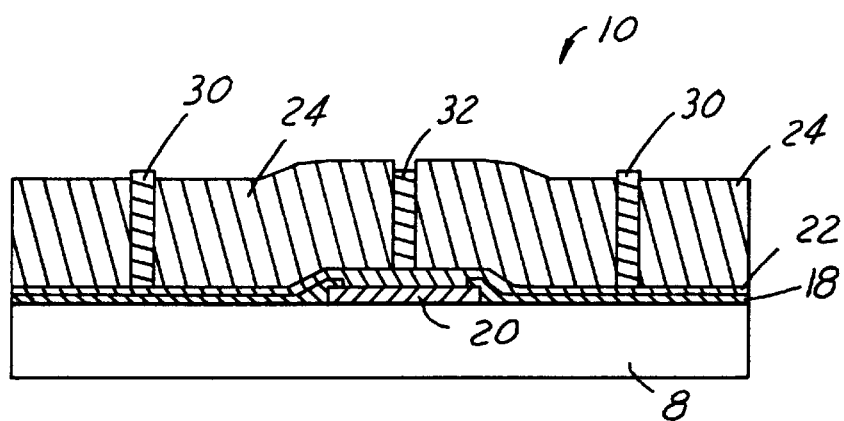
FIG. 5 is an enlarged, cross-sectional view of the present invention IC die of FIG. 4 with the via openings and trench openings filled with a second metal.

The trench openings 26 and the via openings 28 are then filled with a second metal, such as Al, Cu or alloys thereof, forming metal lines 30 and metal vias 32 as shown in FIG. 5. The filling of metal into the openings 26 and 28 can be advantageously conducted by a process such as electroplating or electroless plating wherein the first metal layer 22 is used as a seed layer. The height of the metal lines 30 and the metal vias 32 is approximately the same as the thickness of the photoresist layer 24, i.e. in a range between about 20 μm and about 200 μm. In a preferred embodiment, the height of the metal line 30 and the metal vias 32 formed is about 40 μm. It should be noted that the present invention provides the advantageous feature that the height of the metal lines formed can be easily adjusted by the height of the photoresist layer applied on top of the wafer. This is shown in FIG. 5.

Figure 6:
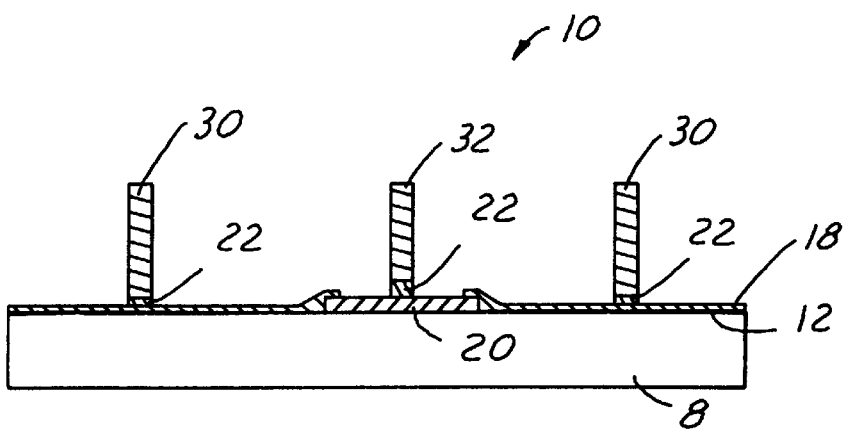
FIG. 6 is an enlarged, cross-sectional view of the present invention IC dies of FIG. 5 with the photoresist layer and the first metal layer not covered by the metal lines in the metal via removed.

FIG. 6 illustrates the present invention wafer 10 after the photoresist layer is stripped away leaving the metal line 30 and the metal via 32 standing on top of the surface 12 of the wafer. It should be noted that the same stripping step also removes the first metal layer 22 at areas not covered by the metal line 30 and the metal via 32.

Figure 7:
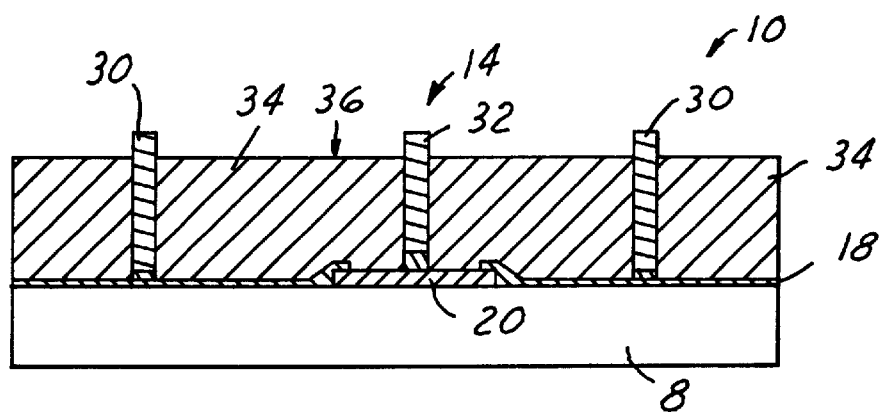
FIG. 7, is an enlarged, cross-sectional view of the present invention IC die of FIG. 6 with an elastomeric material filled in-between the metal lines.
Figure 8:
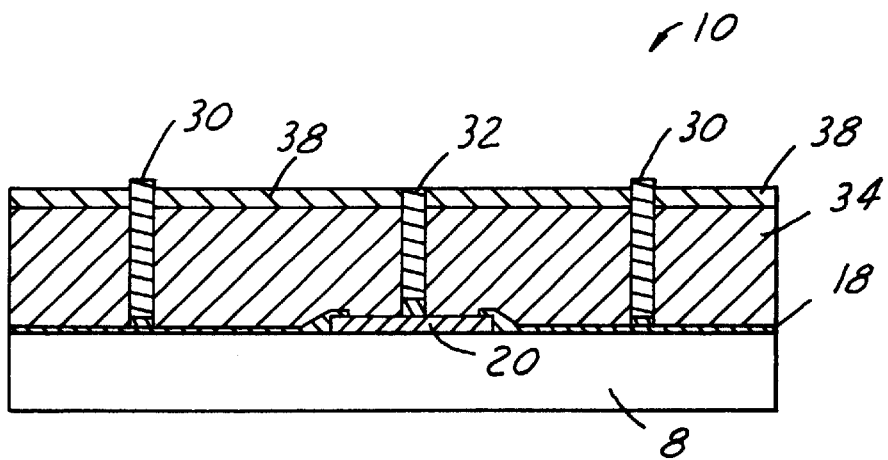
FIG. 8, is an enlarged, cross-sectional view of the present invention IC die of FIG. 7 with an insulting material layer deposited on top.

In the next step of the process, as shown in FIG. 7, an elastomeric material 34 is applied on top of the wafer 10 to a thickness that covers the metal line 30 and metal via 32. The deposition of the elastomeric material layer can be carried out by either a printing technique or by a spin-coating technique. The elastomeric material can be any type of elastic material that has a low Young's modulus, i.e. lower than 10 MPa, and preferably lower than 6 MPa. The elastomeric material 34, after coated on top of the wafer 10, normally requires a curing process which reduces the total thickness of the layer to that shown in FIG. 7. Due to the presence of the metal line 30, the elastomeric material 34 is divided into a multiplicity of elastomeric blocks 36 with one block for each IC chip 14. During the elastomeric material coating process such as by a spin-coating technique, excess elastomeric material may be deposited on top of the wafer 10 such that the top of the metal line 30 and the metal vias 32 is covered by the elastomeric material. The excess elastomeric material can be suitably removed by a dry etching method.

Figure 9:
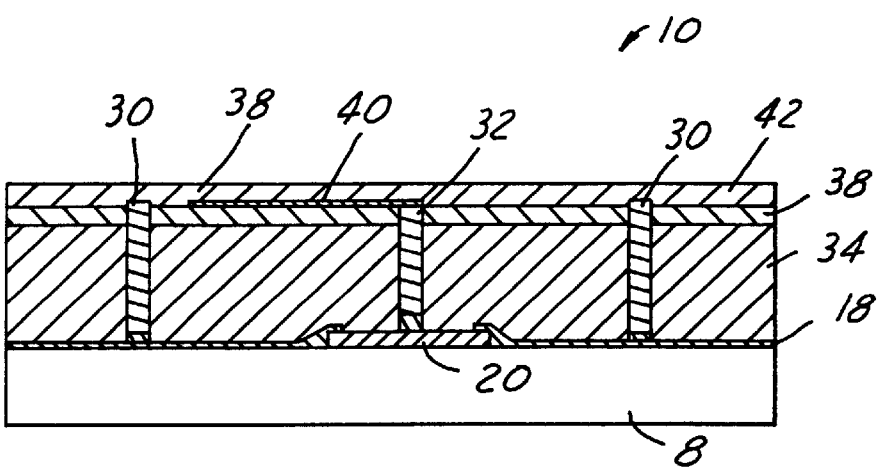
FIG. 9 is an enlarged, cross-sectional view of the present invention IC die of FIG. 8 with an input/output redistribution line formed on top of the metal via and covered by an insulating material layer.

On top of the elastomeric material 34, is then coated with a protective insulating layer 28 such as a polyimide material. A third metal layer is then deposited on top of the insulating material layer 38 and photolithographically formed into input/output redistribution lines 40, as shown in FIG. 9. The I/O redistribution line is connected at one end to the metal via 32 and providing electrical communication with the I/O pad 20 and the associated IC device. The I/O redistribution line 40 can be suitably formed of Al and deposited by a sputtering technique. This is shown in FIG. 9. On top of the I/O redistribution line 40 and the insulating material layer 38 is then deposited a second insulating material layer 42 such as polyimide or any other suitable dielectric materials. This is shown in FIG. 9.

Figure 10:
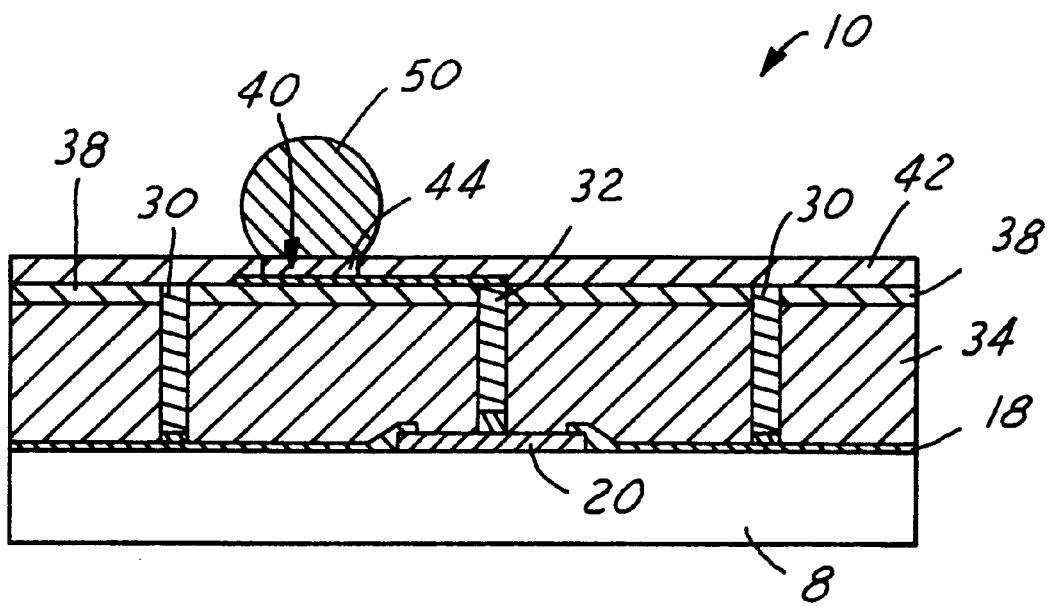
FIG. 10 is an enlarged, cross-sectional view of the present invention IC die of FIG. 9 with an input/output redistribution pad formed in the insulating material layer and a solder bump deposited and reflown into a solder ball on top of the redistribution pad.

On top of the wafer 10, is then applied a masking layer (not shown) for conducting a photolithographic process to open window 44 in the second insulating material layer 42. The window 44 is then deposited first with an under-bump-metallurgy (UBM) layer (not shown) and then a solder bump which is later reflown into a solder ball 50. Then is shown in FIG. 10.

Figure 11:
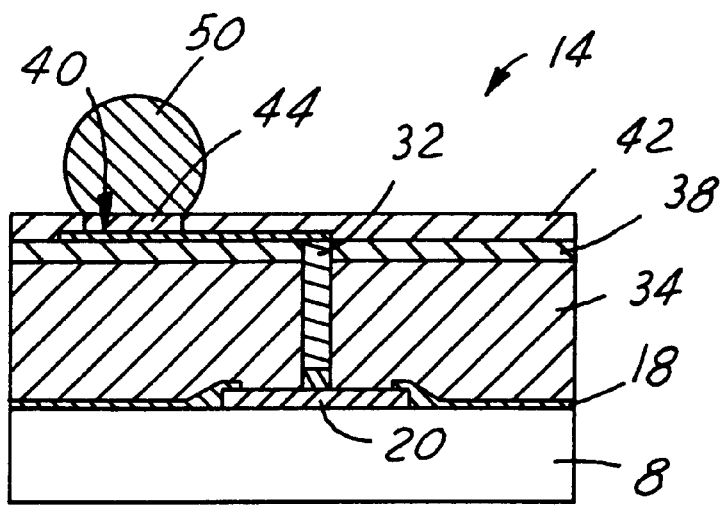
FIG. 11 is an enlarged, cross-sectional view of the present invention IC die of FIG. 10 after it is severed by sawing on the metal lines separating from its adjacent dies.

In the final step of the process, the IC chip 14 is severed from the wafer 10 by either a mechanical means such as by a diamond saw or by a wet etching means. When a diamond saw is used to saw along the metal line 30 on the top surface 12 of the wafer 10, such that the metal line 30 is completely removed as shown in FIG. 11. When the wet etching technique is used, a suitable acid can be used to etch away completely the metal line 30 without damaging the IC chip 14.

The present invention novel method for forming a wafer level package incorporating a multiplicity of elastomeric blocks for stress buffering without the CTE mismatch problem and the package fabricated have therefore been amply described in the above description and in the appended drawings of FIGS. 1–11.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A method for forming a wafer level package incorporating a multiplicity of elastomeric blocks comprising the steps of:
    providing a wafer that is pre-processed with a plurality of IC dies formed on a top surface, each of said plurality of IC dies being spaced-apart from its immediately adjacent IC dies by a distance that is at least a width of a scribe line, each of said plurality of IC dies further having a multiplicity of input/output pads formed on top;
    depositing a first metal layer on said top surface of the wafer;
    depositing a photoresist layer of at least 20 μm thickness on said first metal layer;
    forming a plurality of trench openings separating said plurality of IC dies and a plurality of via openings with each on one of said multiplicity of input/output pads exposing said first metal layer;
    depositing a second metal into and filling said plurality of trench openings forming a plurality of metal lines and said plurality of via openings forming a plurality of metal vias;
    removing said photoresist layer and said first metal layer not covered by said plurality of metal vias; and
    depositing an elastomeric material on top of said wafer filling cavities formed between said plurality of metal lines forming said multiplicity of elastomeric blocks.

2. A method for forming a wafer level package incorporating a multiplicity of elastomeric blocks according to claim 1 further comprising the steps after the deposition of said elastomeric material:
    depositing a first insulating material layer on top of said multiplicity of elastomeric blocks;
    depositing a third metal on top of said first insulating material layer and forming into conductive leads for input/output redistribution; and
    depositing a second insulating material layer on top of said conductive leads and said first insulating material layer.

3. A method for forming a wafer level package incorporating a multiplicity of elastomeric blocks according to claim 1 further comprising the steps of after the deposition of said second insulating material layer:
    forming a plurality of openings in said second insulating material layer exposing said third metal layer forming a plurality of input/output redistribution pads; and
    forming a plurality of solder bumps on said plurality of input/output redistribution pads.

4. A method for forming a wafer level package incorporating a multiplicity of elastomeric blocks according to claim 3 further comprising the step of forming under-bump-metallurgy (UBM) layers on said plurality of input/output redistribution pads before the formation of said plurality of solder bumps.

5. A method for forming a wafer level package incorporating a multiplicity of elastomeric blocks according to claim 1 further comprising the step of depositing said first metal layer with a metal of Cu, Al or alloys thereof.

6. A method for forming a wafer level package incorporating a multiplicity of elastomeric blocks according to claim 1 further comprising the step of depositing said photoresist layer to a thickness between about 20 $\mu$m and about 200 $\mu$m.

7. A method for forming a wafer level package incorporating a multiplicity of elastomeric blocks according to claim 1 further comprising the step of depositing said second metal with a metal of Cu, Al or alloys thereof.

8. A method for forming a wafer level package incorporating a multiplicity of elastomeric blocks according to claim 1, wherein said formation step for said plurality of trench openings and said plurality of via openings further comprising the steps of photolithography and dry etching.

9. A method for forming a wafer level package incorporating a multiplicity of elastomeric blocks according to claim 1 further comprising the step of depositing said elastomeric material by a printing technique or by a spin-coating technique.

10. A method for forming a wafer level package incorporating a multiplicity of elastomeric blocks according to claim 3 further comprising the step of forming said plurality of solder bumps by a technique selected from the group consisting of printing, electroplating and electroless plating.

11. A method for forming a wafer level package incorporating a multiplicity of elastomeric blocks according to claim 3 further comprising the step of forming said plurality of solder bumps with a solder material containing Pb and Sn.

12. A method for forming a wafer level package incorporating a multiplicity of elastomeric blocks according to claim 3 further comprising the step of severing said plurality of IC dies by a mechanical means or by wet etching.

* * * * *